United States Patent
Akutsu et al.

(10) Patent No.: US 9,515,042 B2
(45) Date of Patent: Dec. 6, 2016

(54) ANISOTROPIC CONDUCTIVE FILM, CONNECTION STRUCTURE AND METHOD OF PRODUCING THE SAME

(75) Inventors: Yasushi Akutsu, Tochigi (JP); Kouichi Sato, Tochigi (JP); Shigeyuki Yoshizawa, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 663 days.

(21) Appl. No.: 13/512,752

(22) PCT Filed: Jul. 19, 2011

(86) PCT No.: PCT/JP2011/066309
§ 371 (c)(1),
(2), (4) Date: May 30, 2012

(87) PCT Pub. No.: WO2012/011457
PCT Pub. Date: Jan. 26, 2012

(65) Prior Publication Data
US 2012/0228026 A1 Sep. 13, 2012

(30) Foreign Application Priority Data

Jul. 21, 2010 (JP) ................................ 2010-164134

(51) Int. Cl.
H01B 1/04 (2006.01)
H01B 1/22 (2006.01)
(Continued)

(52) U.S. Cl.
CPC .................. *H01L 24/29* (2013.01); *C09J 7/00* (2013.01); *C09J 9/02* (2013.01); *H01B 1/22* (2013.01); *C08F 2220/283* (2013.01); *C08K 3/08* (2013.01); *C09J 2201/602* (2013.01); *C09J 2205/102* (2013.01); *C09J 2433/00* (2013.01); *H01L 2224/29* (2013.01); *H01L 2224/2919* (2013.01); *H01L 2224/2929* (2013.01); *H01L 2224/29101* (2013.01); *H01L 2224/29198* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2924/00013* (2013.01); *H01L 2924/01004* (2013.01); *H01L 2924/014* (2013.01); *H01L 2924/01005* (2013.01); *H01L 2924/01006* (2013.01); *H01L 2924/01019* (2013.01); *H01L 2924/01023* (2013.01); *H01L 2924/01029* (2013.01); *H01L 2924/01033* (2013.01); *H01L 2924/01045* (2013.01); *H01L 2924/01046* (2013.01); *H01L 2924/01057* (2013.01); *H01L 2924/01078* (2013.01); *H01L 2924/01079* (2013.01); *H01L 2924/01084* (2013.01); *H01L 2924/0665* (2013.01); *H01L 2924/0781* (2013.01); *H01L 2924/07802* (2013.01); *H01L 2924/07811* (2013.01); *H01L 2924/12041* (2013.01);
(Continued)

(58) Field of Classification Search
CPC ............ H01B 3/18; H01B 1/04; H01B 1/22; H01B 13/00; H01R 4/04; B82Y 30/00; C09J 7/00
USPC .......... 252/500–519.1; 428/195.1; 427/208.4
See application file for complete search history.

(56) References Cited

U.S. PATENT DOCUMENTS

| 5,639,546 | A | * | 6/1997 | Bilkadi | ................ | B41M 5/5254 428/331 |
| 2004/0058269 | A1 | * | 3/2004 | Hada | .................... | G03F 7/0397 430/270.1 |

(Continued)

FOREIGN PATENT DOCUMENTS

| CN | 1578931 A | 2/2005 |
| CN | 1910247 A | 2/2007 |

(Continued)

OTHER PUBLICATIONS

Golden et al. ("Preparation of Propylene Carbonate Acrylate and Poly(propylene carbonate acrylate) Electrolyte Elastomer Gels. 13C NMR Evidence for Li+-Cyclic Carbonate Interaction." Macrom, 28, pp. 3468-3470, Apr. 1995).*

(Continued)

*Primary Examiner* — Tri V Nguyen
(74) *Attorney, Agent, or Firm* — Oliff PLC

(57) ABSTRACT

An anisotropic conductive film is obtained by dispersing conductive particles in an insulating adhesive composition including a (meth)acrylate-based monomer composition, a radical polymerization initiator, and a film-forming resin. The (meth)acrylate-based monomer composition includes a (meth)acrylate-based monomer which has a cyclic ester residue or a cyclic amide residue represented by the formula (1):

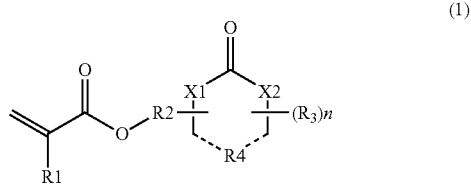

(1)

R1 is a hydrogen atom or a methyl group; R2 is an alkylene group or an alkyloxy group; R3 is an alkyl group, an alkylene group, an aryl group, or a halogen atom; n is an integer of 0 to 3; R4 is absent or an alkylene, dotted lines on both sides of R4 jointly represent a single bond; X1 is absent, or an oxygen atom or a carbon atom; and X2 is an oxygen atom, a nitrogen atom, or a sulfur atom.

9 Claims, No Drawings

(51) Int. Cl.
*H01B 13/00* (2006.01)
*C09J 7/00* (2006.01)
*H01L 23/00* (2006.01)
*C09J 9/02* (2006.01)
*C08K 3/08* (2006.01)
*C08F 220/28* (2006.01)

(52) U.S. Cl.
CPC .. *H01L2924/14* (2013.01); *H01L 2924/15747* (2013.01); *H01L 2924/15788* (2013.01)

(56) References Cited

U.S. PATENT DOCUMENTS

| | | | | |
|---|---|---|---|---|
| 2004/0109995 | A1* | 6/2004 | Wakiya et al. | 428/328 |
| 2005/0288427 | A1* | 12/2005 | Jeon | C08F 283/00 524/555 |
| 2006/0153981 | A1* | 7/2006 | Husemann et al. | 427/208.4 |
| 2009/0061170 | A1* | 3/2009 | Fujikawa et al. | 428/195.1 |
| 2009/0142593 | A1* | 6/2009 | Okochi | C09J 7/0217 428/355 R |
| 2011/0135923 | A1* | 6/2011 | Ahn | C09J 7/0217 428/355 AC |
| 2013/0308219 | A1* | 11/2013 | Kunimoto et al. | 359/891 |

FOREIGN PATENT DOCUMENTS

| | | | |
|---|---|---|---|
| CN | 101463231 A | 6/2009 | |
| CN | 101611659 A | 12/2009 | |
| JP | A-2003-313533 | 11/2003 | |
| JP | 2005036081 A * | 2/2005 | C08F 220/28 |
| JP | A-2005-032952 | 2/2005 | |
| JP | A-2006-024554 | 1/2006 | |
| JP | A-2006-337664 | 12/2006 | |
| JP | 2007165150 A * | 6/2007 | C08F 20/28 |
| JP | A-2010-106244 | 5/2010 | |
| JP | A-2010-111847 | 5/2010 | |

OTHER PUBLICATIONS

Kilambi ("Copolymerization and dark polymerization studies for photopolymerization of novel acrylic monomers." Polymer, 48, pp. 2014-2021, online Feb. 7, 2007).*

Aug. 23, 2011 International Search Report issued in International Patent Application No. PCT/JP2011/066309.

Jing, Z. et al., "Review and Progress of Monomers and Oligomers for Photopolymerization (II)," Coatings Technology & Abstracts, Mar. 31, 2009, pp. 28-32, vol. 30, No. 3.

Chinese Office Action issued in Chinese Patent Application No. 201180035632.6 on Oct. 27, 2014 (with translation).

May 5, 2015 Office Action issued in Chinese Application No. 201180035632.6.

Oct. 10, 2015 Office Action issued in Chinese Application No. 201180035632.6.

* cited by examiner

ANISOTROPIC CONDUCTIVE FILM, CONNECTION STRUCTURE AND METHOD OF PRODUCING THE SAME

TECHNICAL FIELD

The present invention relates to an anisotropic conductive film which can be preferably used in, for example, mounting an IC chip on a circuit board.

BACKGROUND ART

Conventionally, an epoxy compound was used as a main component of a thermosetting adhesive composition in an anisotropic conductive film. However, an acrylic-based monomer, of which radical polymerization is initiated by an organic peroxide, is recently used as a thermosetting adhesive main component, in order to lower a curing temperature during anisotropic conductive connection and shorten a tact time. In this case, unlike an epoxy compound, since a hydroxyl group is not formed during the polymerization, a cured product of the thermosetting adhesive composition has not been sufficient in adhesive strength. For this reason, in a thermosetting adhesive composition it is proposed that a phosphate group-containing acrylate is added to an insulating adhesive composition (Patent Literature 1).

CITATION LIST

Patent Literature

[Patent Literature 1] Japanese Patent Application Laid-Open No. 2003-313533

SUMMARY OF THE INVENTION

Problems to be Solved by the Invention

However, in the case of a phosphate acrylate, although adhesion to a polyimide or metal circuit was improved, it was concerned that corrosion of the metal circuit occurs due to impurities or decomposed matters contained in the phosphate acrylate. Therefore, the phosphate acrylate could not be added in a sufficient amount, thereby making it difficult to realize intended adhesion. Also, in the case of a urethane acrylate, although a urethane acrylate with a relatively high molecular weight should be used in view of stress relaxation, viscosity of an insulating adhesive composition is increased by adding the high molecular weight urethane acrylate. Therefore, there has been a problem that an insulating adhesive composition is cured before it is sufficiently removed from between the electrodes to be connected during anisotropic conductive connection.

An object of the present invention is to solve the above problems associated with the prior arts, and to improve adhesive strength in an anisotropic conductive film in which an acrylic-based monomer of which radical polymerization is initiated by an organic peroxide is used as a thermosetting adhesive main component, without the use of a phosphate group-containing acrylate.

Means for Solving the Problems

The inventors have found that the above object can be achieved by using a (meth)acrylate monomer having a cyclic ester residue or a cyclic amide residue, as an acrylic-based monomer that is a thermosetting component of an insulating adhesive composition for an anisotropic conductive film, thereby completing the present invention.

In other words, the present invention provides an anisotropic conductive film in which conductive particles are dispersed in an insulating adhesive composition including a (meth)acrylate-based monomer composition, a radical polymerization initiator, and a film-forming resin, wherein the (meth)acrylate-based monomer composition includes a (meth)acrylate-based monomer having a cyclic ester residue or a cyclic amide residue.

Also, the present invention provides a method for producing an anisotropic conductive film, including uniformly dispersing and mixing conductive particles in an insulating adhesive composition containing a (meth)acrylate-based monomer composition, a radical polymerization initiator, and a film-forming resin, and coating the resulting mixture on a release film and then drying the mixture, wherein a (meth)acrylate-based monomer having a cyclic ester residue or a cyclic amide residue is used as the (meth)acrylate-based monomer composition.

Furthermore, the present invention provides a connection structure having a terminal of a first electronic part and a terminal of a second electronic part that are bonded by anisotropic conductive connection through the anisotropic conductive film of the above-described present invention.

Furthermore, the present invention provides a method for producing that connection structure, the method including:

temporarily adhering the anisotropic conductive film of the above-mentioned present invention on the terminal of the first electronic part;

temporarily disposing the second electronic part on the temporarily adhered anisotropic conductive film so that the terminal of the first electronic part and the terminal of the second electronic part are opposed to each other; and heating and pressurizing the temporarily disposed second electronic part, thereby connecting the terminal of the first electronic part and the terminal of the second electronic part to each other by anisotropic conductive connection.

Advantageous Effects of the Invention

In the anisotropic conductive film of the present invention in which conductive particles are dispersed in an insulating adhesive composition containing a (meth)acrylate-based monomer composition, a radical polymerization initiator, and a film-forming resin, the (meth)acrylate-based monomer composition contains a (meth)acrylate-based monomer having a cyclic ester residue or a cyclic amide residue. This can improve the adhesive strength of the anisotropic conductive film without the use of a phosphate group-containing acrylate. Accordingly, a conduction resistance value can be lowered, and connection reliability can be improved.

MODE FOR CARRYING OUT THE INVENTION

The present invention is an anisotropic conductive film in which conductive particles are dispersed in an insulating adhesive composition including a (meth)acrylate-based monomer composition, a radical polymerization initiator, and a film-forming resin, wherein the (meth)acrylate-based monomer composition includes a (meth)acrylate-based monomer having a cyclic ester residue or a cyclic amide residue.

Examples of the cyclic ester residue or the cyclic amide residue in the (meth)acrylate having a cyclic amide residue or a cyclic ester residue include a cyclic carboxylic acid ester residue (lactone or lactide) formed by cyclodehydration of a carboxylic group and a hydroxyl group in a hydroxycarboxylic acid; a cyclic carboxylic acid thioester residue formed by condensation and cyclodehydration of a carboxylic group and a thiol group in a thiol carboxylic acid; a cyclic carbonate residue formed by dehydrochlorination-cyclization of a chlorine group in phosgene and a hydroxy group of an alcohol; and a cyclic amide residue formed by cyclodehydration of a carboxylic group and an amino group in an amino acid.

The (meth)acrylate having a cyclic ester residue or a cyclic amide residue used in the present invention is specifically represented by the following formula (1).

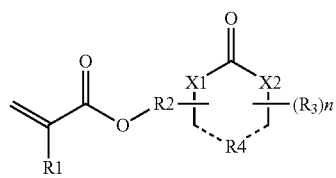
(1)

In the formula (1), R1, R2, R3, n, R4, X1, and X2 have the following meanings.

R1 is a hydrogen atom or a methyl group.

R2 is an alkylene group or an alkyloxy group. Here, examples of the alkylene group include a methylene group, a dimethylene group, and a trimethylene group. Examples of the alkyloxy group include a —CH$_2$O— group, a —C$_2$H$_4$O— group, a —C$_3$H$_6$O— group, and a —CH(CH$_3$)CH$_2$O— group. The alkylene group and the alkyloxy group may be substituted by a substituent such as a hydroxy group, a methyl group, a chlorine atom, and a phenyl group.

R3 is an alkyl group, an alkylene group, an aryl group, or a halogen atom. Examples of the alkyl group include a methyl group, an ethyl group, and a propyl group. Examples of the alkylene group include a vinyl group and an allyl group. Examples of the aryl group include a phenyl group and a naphthyl group. These may be substituted by the substituent such as a hydroxy group, a methyl group, a chlorine atom, and a phenyl group. n is an integer of 0 to 3.

R4 is absent or an alkylene group which may be substituted by an oxygen atom, wherein when R4 is absent, the dotted lines on both sides of R4 jointly represent a single bond. Examples of the alkylene group which may be substituted by an oxygen atom include a methylene group, a dimethylene group, a trimethylene group, a —CH$_2$OCH$_2$— group, a —C$_2$H$_4$OC$_2$H$_4$— group, a —CH$_2$O— group, a —C$_2$H$_4$O— group, a —C$_3$H$_6$O— group, and a —CH(CH$_3$)CH$_2$O— group.

X1 is absent, or an oxygen atom or a carbon atom, wherein when X1 is absent, the solid lines on both sides of X1 jointly represent a single bond.

X2 is an oxygen atom, a nitrogen atom, or a sulfur atom.

In the present invention, it is preferable to use a (meth)acrylate having a cyclic ester residue in order to improve adhesive strength. Specifically, it is preferable to use a (meth)acrylate represented by the following constitutional formula (2) or (3) (where R1 is a hydrogen atom or a methyl group).

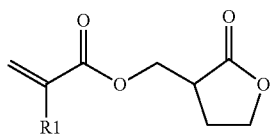
(2)

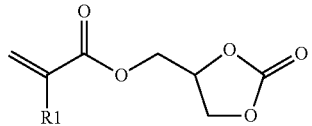
(3)

In the present invention, when the added amount of the (meth)acrylate-based monomer having a cyclic ester residue or a cyclic amide residue in the (meth)acrylate-based monomer composition is too small, adhesive strength is likely to be reduced, and when the amount is too large, film strength is likely to be reduced thereby failing to obtain a film form. Therefore, the added amount is preferably 1 to 50% by mass, and more preferably 3 to 30% by mass.

In the present invention, as a (meth)acrylate-based monomer other than the (meth)acrylate-based monomer having a cyclic ester residue or a cyclic amide residue described above, a monofunctional or multifunctional (meth)acrylate having two or more functions can be used as necessary. In the present invention, it is preferable to use a multifunctional (meth)acrylate in at least part of the (meth)acrylic monomer so that the adhesive becomes thermosetting.

Examples of the monofunctional (meth)acrylate (where a (meth)acrylate includes acrylate and methacrylate) include methyl(meth)acrylate, ethyl(meth)acrylate, n-propyl(meth)acrylate, i-propyl(meth)acrylate, n-butyl(meth)acrylate, i-butyl(meth)acrylate, t-butyl(meth)acrylate, 2-methyl butyl (meth)acrylate, n-pentyl(meth)acrylate, n-hexyl(meth)acrylate, n-heptyl(meth)acrylate, 2-methylhexyl(meth)acrylate, 2-ethylhexyl(meth)acrylate, 2-butyl hexyl(meth)acrylate, isooctyl(meth)acrylate, isopentyl(meth)acrylate, isononyl (meth)acrylate, isodecyl(meth)acrylate, cyclohexyl(meth)acrylate, benzyl(meth)acrylate, phenoxy(meth)acrylate, n-nonyl(meth)acrylate, n-decyl(meth)acrylate, lauryl(meth)acrylate, hexadecyl(meth)acrylate, stearyl(meth)acrylate and the like. Examples of the difunctional (meth)acrylate include bisphenol F EO-modified di(meth)acrylate, bisphenol A EO-modified di(meth)acrylate, polypropyleneglycol di(meth)acrylate, polyethyleneglycol(meth)acrylate, tricyclodecanedimethylol di(meth)acrylate, dicyclopentadiene (meth)acrylate and the like. Examples of the trifunctional (meth)acrylate include trimethylolpropane tri(meth)acrylate, trimethylolpropane PO-modified (meth)acrylate, isocyanuric acid EO-modified tri(meth)acrylate and the like. Examples of the (meth)acrylate having four or more functions include dipentaerythritol penta(meth)acrylate, pentaerythritol hexa(meth)acrylate, pentaerythritol tetra(meth)acrylate, ditrimethylolpropane tetraacrylate and the like. Besides, a multifunctional urethane (meth)acrylate can be used. Specific examples thereof include M1100, M1200, M1210, and M1600 (manufactured by Toagosei Co., Ltd.); AH-600 and AT-600 (manufactured by Kyoeisha Chemical Co. Ltd.), and the like.

When the added amount of the (meth)acrylate-based monomer composition containing a (meth)acrylate-based monomer having a cyclic ester residue or a cyclic amide residue in the insulating adhesive composition is too small, adhesive strength is likely to be reduced, and when the added amount is too large, film strength is likely to be reduced, thereby failing to obtain a film form. Therefore, the added amount is preferably 1 to 50% by mass, and more preferably 3 to 30% by mass.

The radical polymerization initiator can be appropriately selected from known radical polymerization initiators.

Examples thereof include: a peroxide-based polymerization initiator such as diacyl peroxide, peroxydicarbonate, peroxyester, peroxy ketal, dialkyl peroxide, and hydroperoxide, an azo-based polymerization initiator such as azobis butyronitrile, a redox-based polymerization initiator, and the like. In particular, benzoyl peroxide can be preferably used in view of material availability and curing properties.

When the added amount of the radical polymerization initiator in the insulating adhesive composition is too small, curing is likely to become insufficient, and when the added amount is too large, the degree of polymerization is likely to be reduced, thereby deteriorating film properties. Therefore, the added amount of the radical polymerization initiator with respect to 100 parts by mass of the (meth)acrylate-based monomer composition is preferably 1 to 40 parts by mass, and more preferably 2 to 20 parts by mass.

The film-forming resin can be appropriately selected from known film-forming resins depending on the application of an anisotropic conductive film. Examples of such a film-forming resin include a phenoxy resin, an epoxy resin, an unsaturated polyester resin, a saturated polyester resin, a urethane resin, a butadiene resin, a polyimide resin, a polyamide resin, a polyolefin resin, and the like. They can be used alone or in combination of two or more of them. Among these film-forming resins, a phenoxy resin as synthesized from bisphenol A and epichlorohydrin can be preferably used in view of film-forming properties, processability, and connection reliability. A commercially available product can be used.

When the added amount of the film-forming resin in the insulating adhesive composition is too small, film properties are likely to be reduced, and when the added amount is too large, resin removal performance during pressurized adhesion is likely to be reduced. Therefore, the added amount of the film-forming resin in the insulating adhesive composition except a solvent is preferably 10 to 80 parts by mass, and more preferably 20 to 60 parts by mass.

Various kinds of additives which have been conventionally used in an insulating adhesive of an anisotropic conductive film can be added to the insulating adhesive composition used in the present invention, to an extent that the effect of the present invention is not impaired. Examples of such an additive include a silane coupling agent, an inorganic filler, a rubber component, a pigment, an antioxidant, a diluent, a solvent, and an antistatic agent.

The conductive particles constituting the anisotropic conductive film of the present invention can be appropriately selected from the conductive particles conventionally used in an anisotropically conductive adhesive. Examples of such conductive particles include metal particles such as nickel, cobalt, silver, copper, gold, and palladium, and electroless-plated metal-coated resin particles in which the surface of a polystyrene particle or a guanamine resin particle is coated with electroless-plated metal. Such resin particles have a size of preferably 1 to 20 μm, and more preferably 2 to 10 μm.

Also, when the amount of the conductive particles in the anisotropic conductive film is too small, there is a concern that connection reliability is reduced, and when the amount is too large, there is a concern that a short occurs. Therefore, the amount of the conductive particles is preferably 1 to 50% by mass, and more preferably 2 to 30% by mass.

The anisotropic conductive film of the present invention may be laminated with an insulating adhesive film. A process of applying underfill can be omitted. Such an insulating adhesive film can have a basically same configuration as the anisotropic conductive film of the present invention except that conductive particles are not used.

The anisotropic conductive film of the present invention can be produced by: uniformly dispersing and mixing conductive particles in an insulating adhesive composition containing a (meth)acrylate-based monomer composition, which contains a (meth)acrylate-based monomer having a cyclic ester residue or a cyclic amide residue, a radical polymerization initiator, and a film-forming resin by a known dispersion method; coating the resulting mixture to a release film such as a silicone release-treated polyester film by a known coating method such as a bar coater to obtain a coating with a dry thickness of 10 to 50 μm; and, for example, placing the coated film in a constant temperature bath at a temperature of 50 to 90° C. and drying the film. Furthermore, in cases where an insulating adhesive film is laminated, an insulating adhesive composition may be applied to an anisotropic conductive film and then dried.

The anisotropic conductive film of the present invention produced as described above can be preferably applied in producing a connection structure by anisotropic conductive connection. In such an connection structure, the anisotropic conductive connection is established between a terminal such as an electrode pad and a bump using copper, gold, and the like of a first electronic part such as a glass circuit board, a silicon circuit board, a glass epoxy circuit board, and a terminal such as a gold or solder bump of a second electronic part such as an IC chip, a LED chip, and a flexible printed circuit board (FPC), through the anisotropic conductive film according to the present invention.

This connection structure can be produced as described below.

First, the anisotropic conductive film of the present invention is temporarily adhered onto a terminal of the first electronic part. More specifically, the anisotropic conductive film of the present invention is aligned and placed on the terminal of the first electronic part. Then, the placed anisotropic conductive film is heated at a temperature lower than the substantial curing temperature while pressed by a heating and pressurizing bonder to develop adhesive properties on the surface of the anisotropic conductive film, thereby temporarily adhering the anisotropic conductive film onto the first electronic part with the aid of the adhesive properties.

As the heating and pressurizing bonder, a known bonder can be used Although a pressing surface of the bonder may be metal such as stainless steel, the pressing surface may be an elastic body, like a thermo-compression head as applied in the mounting method according to claim 1 of each of Japanese Patent Application Laid-Open Nos. 2005-32952 and 2006-24554.

Next, the second electronic part is temporarily disposed on the temporarily adhered anisotropic conductive film such that the terminals of the first and second electronic parts are opposed to each other. It is preferable that the second electronic part be temporarily disposed while the surface of the anisotropic conductive film exhibits adhesive properties.

Furthermore, the temporarily disposed second electronic part is heated and pressurized by using a heating and pressurizing bonder to bring the terminals of the first and second electronic parts into conduction while preventing a short between the neighboring terminals from occurring by the conductive particles which are placed and crushed between these terminals. Moreover, the insulating adhesive composition is cured to bond the first electronic part and the second electronic part. Accordingly, a connection structure can be obtained. Specific examples of such a connection structure may include a liquid crystal panel, an organic EL panel, a LED, a semiconductor apparatus, and the like.

EXAMPLES

The present invention will be specifically described below by way of Examples.

Reference Example 1

Synthesis of Lactone Acrylate

Acrylic acid (72.1 g, 1 mole), α-hydroxy-γ-butyrolactone (112.3 g, 1.1 mole), 3 g of p-toluenesulfonic acid, and 1 L of toluene were placed in a reactor, and then heated and refluxed while removing water for 5 hours for esterification. Toluene was distilled and removed under reduced pressure, and the residue was distilled under reduced pressure. Accordingly, γ-butyrolactone-2-yl acrylate was obtained in a yield of 50%.

Reference Example 2

Synthesis of Cyclic Carbonate Acrylate

The same synthesis process as in Reference Example 1 was repeated, except that 4-hydroxymethyl-1,3-dioxolane-2-one was used instead of α-hydroxy-γ-butyrolactone, thereby yielding 1,3-dioxolane-2-one-4-yl methyl acrylate.

Reference Example 3

Synthesis of Lactam Acrylate

The same synthesis process as in Reference Example 1 was repeated, except that α-hydroxy-γ-butyrolactam was used instead of α-hydroxy-γ-butyrolactone, thereby yielding γ-butyrolactam-2-yl acrylate.

Reference Example 4

Preparation of Insulating Adhesive Paste

An insulating adhesive paste was prepared by mixing 60 parts by mass of a phenoxy resin (YP50 manufactured by Tohto Kasei Co., Ltd.), 30 parts by mass of the cyclic carbonate acrylate prepared in Reference Example 2, 20 parts by mass of urethane acrylate (U-4HA manufactured by Shin Nakamura Chemical Co., Ltd.), and 5 parts by mass of benzoyl peroxide (NYPER BW manufactured by NOF CORPORATION) in a mixed solvent of ethyl acetate and toluene (1/1 (V/V)) so that the solid content is 50%.

Reference Example 5

Preparation of Insulating Adhesive Paste

An insulating adhesive paste was prepared by mixing 60 parts by mass of phenoxy resin (YP50 manufactured by Tohto Kasei Co., Ltd.), 30 parts by mass of a chain ester acrylate (NK Ester A-SA manufactured by Shin Nakamura Chemical Co., Ltd.), 20 parts by mass of urethane acrylate (U-4HA manufactured by Shin Nakamura Chemical Co., Ltd.), and 5 parts by mass of benzoyl peroxide (NYPER BW manufactured by NOF CORPORATION) in a mixed solvent of ethyl acetate and toluene (1/1 (V/V)) so that the solid content is 50%.

Examples 1 to 5 and Comparative Example 1

Formation of Single-Layer Anisotropic Conductive Film

The added components of each of Examples 1 to 5 and Comparative Example 1 in Table 1 were mixed in a mixed solvent of ethyl acetate and toluene (1/1 (V/V)) so that the solid content is 50%, to prepare an anisotropically conductive adhesive paste. The obtained paste was applied to a 50 μm thick release-treated polyethylene terepthalate so that the dry thickness reaches 20 μm, and then dried in an oven at 70° C. for 5 minutes, to prepare an anisotropic conductive film.

Example 6 to 15 and Comparative Examples 2 and 3

Formation of Two-Layered Anisotropic Conductive Film

As shown in Table 2, the anisotropic conductive film obtained in each of Examples 1 to 5 and Comparative Example 1 was coated with the insulating adhesive paste of Reference Example 4 or 5 so that the dry thickness thereof is 20 μm, and then dried in an oven at 70° C. for 5 minutes, to prepare a two-layered anisotropic conductive film in which the insulating adhesive layer is laminated.

<Evaluation>

With respect to each of the obtained anisotropic conductive films, a test was performed to evaluate adhesive strength, conductive resistance, connection reliability as described below.

(Adhesive Strength)

An anisotropic conductive film having a width of 10 mm was temporarily adhered to a glass substrate having a thickness of 0.7 mm over the entire surface of which an ITO film having a thickness of 200 nm was formed. Then, a flexible printed circuit board (manufactured by Sony Chemical & Information Device Corporation, size: 20 mm×40 mm×total thickness 46 μm (PI/Cu=38 μm/8 μm, pitch 50 μm)) was temporarily fixed on the anisotropic conductive film. Bonding was performed under the conditions of 160° C., 4 MPa, and 4 seconds, and then a 90 degree peeling test was performed at a peeling rate of 50 mm/min using a peeling testing device (Tensilon manufactured by ORIENTEC Co., Ltd.). The obtained adhesive strength [N/cm] is shown in Table 1. It is desirable that the adhesive strength be practically 6 N/cm and above.

(Conductive Resistance)

An anisotropic conductive film was placed between a flexible printed circuit board (manufactured by Sony Chemical & Information Device Corporation, size: 20 mm×40 mm×total thickness 46 μm (PI/Cu=38 μm/8 μm, pitch 50 μm)), and a glass epoxy substrate (679F manufactured by Hitachi Chemical Co., Ltd.: 38 mm×38 mm×0.6 mm thick) having an electrode pad (Au/Ni plated Cu base) on which a solder surface layer having a thickness of 20 μm was formed, and then heated and pressurized at 160° C. under a pressure of 4 MPa for 4 seconds by a heating and pressurizing bonder, to obtain a connection structure. The conductive resistance between an IC chip and the circuit board in the obtained connection structure was measured by a four terminal method. The measured resistance value is shown in Table 1. It is required that the conductive resistance be practically 1Ω or lower.

(Connection Reliability)

The connection structure in which conductive resistance had been measured was left stand in a high-temperature and high-humidity vessel (85° C., 85% RH) for 500 hours, and then conductive resistance was measured by a four terminal method. The measured resistance value was evaluated in accordance with the criteria below.

Rank: Criteria
AA: Less than 3Ω
A: 3Ω and above, and less than 5Ω
B: 5Ω and above, and less than 10Ω
C: 10Ω and above

TABLE 1

| COMPONENTS (PARTS BY MASS) | Example | | | | | Comparative Example |
|---|---|---|---|---|---|---|
| | 1 | 2 | 3 | 4 | 5 | 1 |
| PHENOXY RESIN *1 | 60 | 60 | 60 | 60 | 60 | 60 |
| LACTONE ACRYLATE *2 | 50 | 30 | 1 | 10 | — | — |
| CYCLIC CARBONATE ACRYLATE *3 | — | — | — | — | 30 | — |
| CHAIN ESTER ACRYLATE *4 | — | — | — | 20 | — | 30 |
| URETHANE ACRYLATE *5 | 20 | 20 | 20 | 20 | 20 | 20 |
| BENZOYL PEROXIDE *6 | 5 | 5 | 5 | 5 | 5 | 5 |
| Au/Ni PLATED RESIN PARTICLES *7 | 5 | 5 | 5 | 5 | 5 | 5 |
| ADHESIVE STRENGTH [N/cm] | 8 | 8 | 7 | 8 | 9 | 4 |
| CONDUCTIVE RESISTANCE [Ω] | 1 | 1 | 1 | 1 | 1 | 3 |
| CONNECTION RELIABILITY (UNDER HIGH TEMPERATURE AND HIGH HUMIDITY) | A | AA | A | A | AA | C |

*1 YP50 manufactured by TOHTO KASEI CO., LTD.
*2 Lactone acrylate prepared in Reference Example 1
*3 Cyclic carbonate acrylate prepared in Reference Example 2
*4 NK ester A-SA manufactured by SHIN NAKAMURA CHEMICAL CO., LTD.
*5 U-4HA manufactured by SHIN NAKAMURA CHEMICAL CO., LTD.
*6 NYPER BW manufactured by NOF CORPORATION
*7 SEKISUI CHEMICAL CO., LTD.

TABLE 2

| COMPONENTS (PARTS BY MASS) | Example | | | | | | | | | | Comparative Example | |
|---|---|---|---|---|---|---|---|---|---|---|---|---|
| | 6 | 7 | 8 | 9 | 10 | 11 | 12 | 13 | 14 | 15 | 2 | 3 |
| ANISOTROPIC CONDUCTIVE FILM *8 | 1 | 1 | 2 | 2 | 3 | 3 | 4 | 4 | 5 | 5 | 1 | 1 |
| INSULATING ADHESIVE LAYER *9 | 4 | 5 | 4 | 5 | 4 | 5 | 4 | 5 | 4 | 5 | 4 | 5 |
| ADHESIVE STRENGTH [N/cm] | 7 | 7 | 8 | 8 | 7 | 7 | 8 | 8 | 8 | 8 | 4 | 4 |
| CONDUCTIVE RESISTANCE [Ω] | 1 | 1 | 1 | 1 | 2 | 1 | 1 | 1 | 1 | 1 | 3 | 3 |
| CONNECTION RELIABILITY (UNDER HIGH TEMPERATURE AND HIGH HUMIDITY) | A | AA | A | AA | B | A | A | AA | A | AA | C | C |

*8 Example Number (Comparative Example Number for Comparative Examples 2 and 3)
*9 Reference Example Number As shown in Table 1, the anisotropic conductive film of each of Examples 1 to 5, in which an acrylate having a cyclic ester residue was used as a (meth)acrylate-based monomer, showed favorable adhesive strength, conductive resistance and connection reliability. The anisotropic conductive film of Examples 5 in which a cyclic carbonate acrylate was used was especially excellent in adhesive strength, compared to the anisotropic conductive films of Examples 1 to 4 in which a lactone acrylate was used.

On the other hand, the anisotropic conductive film of Comparative Example 1, in which a chain ester acrylate [CH$_2$CHCOOCH$_2$CH$_2$OCOCH$_2$CH$_2$COOH] was used without the use of a (meth)acrylate-based monomer having a cyclic ester residue, was inferior in adhesive strength, conductive resistance, and connection reliability to any of the anisotropic conductive films of Examples 1 to 5.

Also, as shown in Table 2, the layered anisotropic conductive film of each of Examples 6 to 15, in which an insulating connection layer was laminated on the anisotropic conductive film of each of Examples 1 to 5 showed similar results to that of each of Examples 1 to 5.

On the other hand, the two-layered anisotropic conductive films of Comparative Examples 2 and 3, in which a chain ester acrylate [CH$_2$CHCOOCH$_2$CH$_2$OCOCH$_2$CH$_2$COOH] was used without the use of a (meth)acrylate-based monomer having a cyclic ester residue, was inferior in adhesive strength, conductive resistance, and connection reliability to any of the two-layered anisotropic conductive films of Examples 6 to 15.

Example 16

An anisotropic conductive film was produced in the same manner as in Example 1, except that γ-butyrolactam-2-yl acrylate was used instead of γ-butyrolactone-2-yl acrylate, and then evaluated. As a result, a result similar to the anisotropic conductive film of Example 1 was obtained.

INDUSTRIAL APPLICABILITY

According to the anisotropic conductive film of the present invention, adhesive strength of the anisotropic conductive film in which an acrylic-based monomer of which radial polymerization is initiated by an organic peroxide is used as a thermosetting adhesive main component, can be improved without the use of a phosphate group-containing acrylate. Therefore, the anisotropic conductive film according to the present invention is useful in producing a connection structure such as a semiconductor apparatus.

The invention claimed is:

1. An anisotropic conductive film comprising an insulating adhesive composition and conductive particles that are uniformly dispersed in the insulating adhesive composition, wherein:
the insulating adhesive composition comprises a (meth) acrylate-based monomer composition, a radical polymerization initiator, and a film-forming resin;
the (meth)acrylate-based monomer composition includes a (meth)acrylate-based monomer having a cyclic ester residue or a cyclic amide residue; and
the (meth)acrylate-based monomer having a cyclic ester residue is represented by the following constitutional formula (2) or (3):

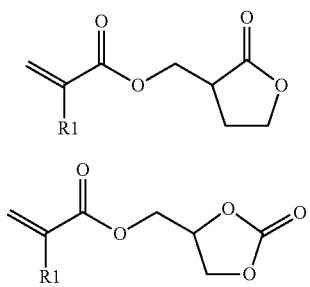

where R1 is a hydrogen atom or a methyl group.

2. The anisotropic conductive film according to claim 1, wherein the (meth)acrylate-based monomer having a cyclic amide residue is represented by the following constitutional formula (1):

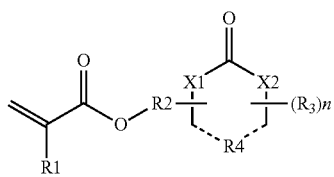

where in the formula, R1 is a hydrogen atom or a methyl group; R2 is an alkylene group or an alkyloxy group; R3 is an alkyl group, an alkylene group, an aryl group, or a halogen atom; n is an integer of 0 to 3; R4 is absent or an alkylene group which may be substituted by an oxygen atom, wherein when R4 is absent, dotted lines on both sides of R4 jointly represent a single bond; X1 is absent, or an oxygen atom or a carbon atom, wherein when X1 is absent, solid lines on both sides of X1 jointly represent a single bond; and X2 is a nitrogen atom.

3. The anisotropic conductive film according to claim 1, wherein the conductive particles are electroless-plated metal-coated resin particles having a size of 1 to 20 μm.

4. The anisotropic conductive film according to claim 1, wherein the (meth)acrylate-based monomer composition is present in the insulating adhesive composition in an amount of 1 to 50% by mass based on a total mass of the insulating adhesive composition.

5. A method for producing an anisotropic conductive film, comprising uniformly dispersing and mixing conductive particles in an insulating adhesive composition including a (meth)acrylate-based monomer composition, a radical polymerization initiator, and a film-forming resin; and coating the resulting mixture on a release film and then drying the mixture, wherein
a (meth)acrylate-based monomer having a cyclic ester residue or a cyclic amide residue is used as the (meth) acrylate-based monomer composition; and
the (meth)acrylate-based monomer having a cyclic ester residue is represented by the following constitutional formula (2) or (3):

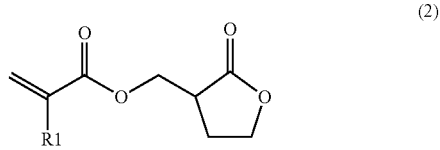

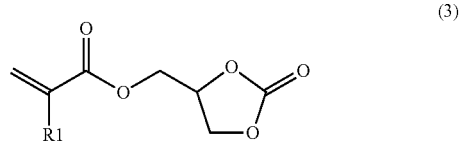

where R1 is a hydrogen atom or a methyl group.

6. The production method according to claim 5, wherein the (meth)acrylate-based monomer having a cyclic amide residue is represented by the following constitutional formula (1):

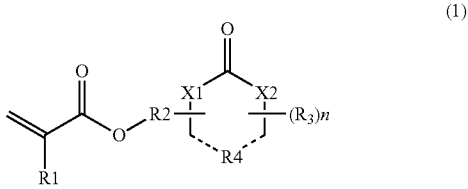

where in the formula, R1 is a hydrogen atom or a methyl group; R2 is an alkylene group or an alkyloxy group; R3 is an alkyl group, an alkylene group, an aryl group, or a halogen atom; n is an integer of 0 to 3; R4 is absent or an alkylene group which may be substituted by an oxygen atom, wherein when R4 is absent, dotted lines on both sides of R4 jointly represent a single bond; X1 is absent, or an oxygen atom or a carbon atom, wherein when X1 is absent, solid lines on both sides of X1 jointly represent a single bond; and X2 is a nitrogen atom.

7. The method according to claim 5, wherein the (meth) acrylate-based monomer composition is present in the insulating adhesive composition in an amount of 1 to 50% by mass based on a total mass of the insulating adhesive composition.

8. A connection structure having a terminal of a first electronic part and a terminal of a second electronic part that are bonded by anisotropic conductive connection through the anisotropic conductive film according to claim 1.

9. A method for producing a connection structure wherein a terminal of a first electronic part and a terminal of a second electronic part are bonded by anisotropic conductive connection, the method comprising:
- temporarily adhering the anisotropic conductive film according to claim 1 on the terminal of the first electronic part;
- temporarily disposing the second electronic part on the temporarily adhered anisotropic conductive film so that the terminal of the first electronic part and the terminal of the second electronic part are opposed to each other; and
- heating and pressurizing the temporarily disposed second electronic part, thereby connecting the terminal of the first electronic part and the terminal of the second electronic part to each other by anisotropic conductive connection.

* * * * *